Nov. 26, 1968
L. BABANY ET AL
3,413,565
MULTI-RANGE FREQUENCY GENERATOR USING FREQUENCY DIVIDING TECHNIQUES
Filed Jan. 25, 1967
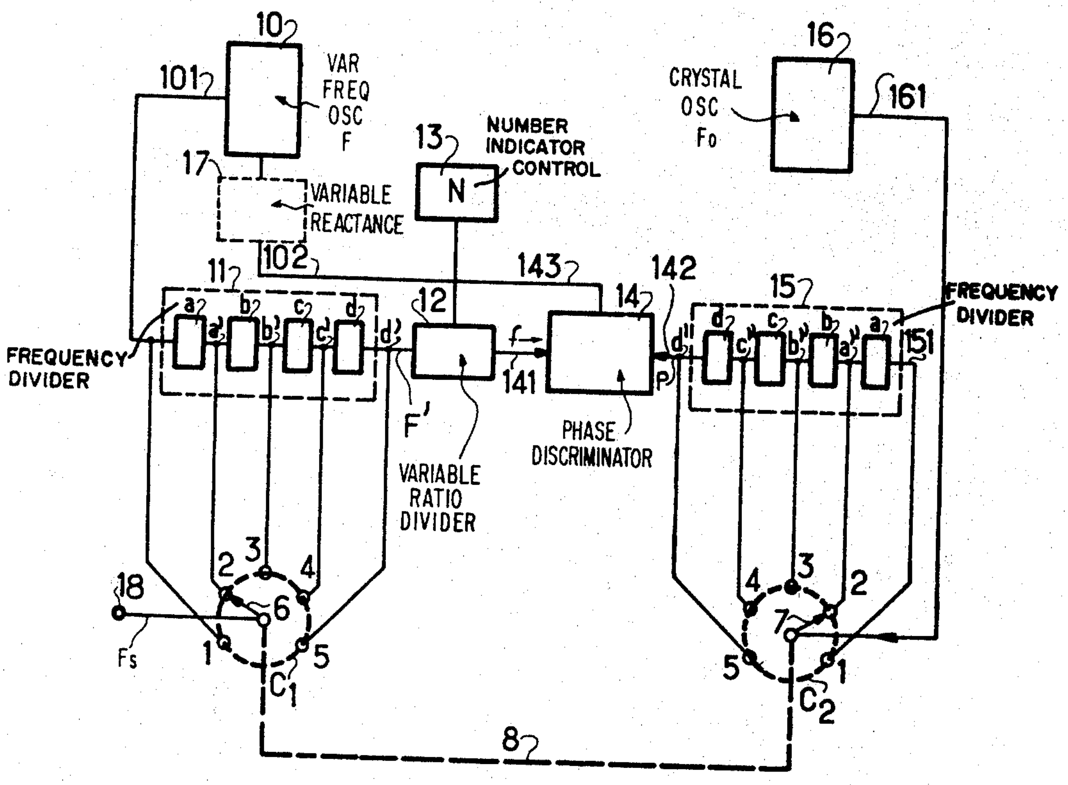

United States Patent Office 3,413,565

Patented Nov. 26, 1968

3,413,565

MULTI-RANGE FREQUENCY GENERATOR USING FREQUENCY DIVIDING TECHNIQUES

Lucien Babany, Blanc Mesnil, Didier Bernadet, Courcel-les-sur-Viosnes, and Michel Marchal, Paris, France, assignors to C.I.T.—Compagnie Industrielle des Telecommunications, Paris, France Filed Jan. 25, 1967, Ser. No. 611,761

Claims priority, application France, Jan. 25, 1966, 47,150

11 Claims. (Cl. 331—18)

ABSTRACT OF THE DISCLOSURE

This application discloses a frequency generator for supplying a plurality of discrete frequencies evenly spaced over a wide frequency range wherein a variable frequency oscillator is connected to a first input of a phase discriminator through a fixed ratio frequency divider connected in series with a variable ratio frequency divider, a stabilized reference frequency oscillator is connected via another fixed ratio frequency divider to a second input of the phase discriminator, the output of which is connected to the variable frequency oscillator in control thereof. A plurality of discrete frequencies are obtained by providing both the fixed ratio dividers as series of individual divider elements and keeping the selected ratio of fixed division connected to the phase discriminator inputs equal.

*Background of the invention*

For many reasons, including cost, reliability and overall dimensioning, it is advantageous to build signal generators having a single oscillator. However conventional signal oscillators generally do not cover ranges over 1.5 octave and a generator covering a range of some four or five octaves, for example, cannot be built without making use of frequency multiplying or dividing means, the latter being preferred for technological reasons.

Circuits in which frequency dividers are used for forming a quantized frequency spectrum have been known heretofore. In particular certain known frequency synthetizers comprise variable reactance oscillators providing a variable frequency F connected to the input of a first variable ratio frequency divider having a ratio $n_1$, the output of which is connected to a first input of a phase discriminator, to the second input of which is connected a fixed frequency oscillator providing a frequency $F_o$ through a fixed ratio frequency divider having a ratio $n_2$. The output of the phase discriminator provides a feedback signal controlling the variable reactance oscillator so that in the synchronized state the relation between the frequencies is $$\frac{F}{n_1}=\frac{F_o}{n_2};$$

that is, $$F=\frac{n_1}{n_2}F_o$$

$n_1$ being a variable integer.

In such known circuits, it is advantageous to make use of integrated type counters as the frequency dividers for reason of their compactness, dependability and other inherent advantages. However, these integrated circuit type counters do not work satisfactorily at frequencies above several megacycles. Therefore, such an expedient has been unsuitable heretofore for most purposes.

In addition, the known circuits using multiplying or dividing means have not obtained the maximum operating range of frequencies available in view of the basic equipment at hand. Thus, these devices have been restricted to a range of frequencies solely within the capabilities of the variable ratio frequency divider.

*Brief description of the invention*

It is therefore advantageous to decrease the required maximum working frequency of the counter by inserting a fixed ratio frequency divider upstream of the variable frequency divider. The present invention derives in part from the applicant's discovery of the fact that if a fixed ratio frequency divider is inserted between a relatively high frequency oscillator (several tens of megacycles) and an adjustable counter working as a variable ratio frequency divider having a ratio N, the frequency obtained at the input to the counter is low enough to permit the use of counters of the integrated circuit type.

In addition, provision of the single fixed ratio frequency divider connected to the high frequency oscillator by a plurality of series connected elementary fixed ratio frequency dividers presents further advantages since this enables the extraction, at the output of each elementary divider, of one or more sub-ranges lower than the range of the variable high frequency oscillator. Let us assume, for example, that the range of the variable oscillator is 20–40 megacycles and that the fixed ratio frequency divider comprises four binary dividing stages the ranges of which are respectively 10–20 mc., 5–10 mc., 2.5–5 mc., and 1.25–2.5 mc. It is therefore possible to obtain five sub-ranges covering the range 1.25–40 mc. from a single variable oscillator having a range of 20–40 mc. By means of a conventional commutator connected to the elementary dividers, it is therefore possible to have an output supplying any one of the above sub-ranges.

The counter serving as the variable ratio frequency divider connected to the output of the last stage of the fixed ratio frequency divider providing a frequency $f$ supplies a frequency $f/N$ which is made equal to a quantization P by means of a phase discriminator and a feedback circuit to the variable frequency oscillator. In general the quantization P is obtained by division $P=F_0/n_2$, $F_0$ being a stabilized reference frequency derived from a crystal oscillator, the division by $n_2$ being carried out by a second fixed ratio frequency divider connected to the output of the crystal oscillator. There is, however, an important condition that is not satisfied by the above described circuit alone if N is to vary over corresponding ranges; that is, the quantization is not constant over the whole range of frequencies since in this circuit the quantization is equal to P for the lowest range (1.25–2.5 mc.), 2P for the range 2.5–5 mc. . . . and 16P for the range 20–40 mc. due to the fact that the higher sub-ranges are respectively the second, fourth, eighth and sixteenth multiples of the lowest sub-range. Thus, in accordance with the invention, the second fixed ratio frequency divider must also be provided as a plurality of elementary dividers connected to the crystal oscillator via a commutator coordinated with the commutator connected to the first fixed ratio divider.

According to the invention a generator supplying a plurality of discrete frequencies over a relatively wide range comprises a first controlled variable frequency oscillator connected to a first input of a phase discriminator through a first fixed ratio frequency divider, formed by a plurality of series-connected elementary divider stages, connected in series with a counter working as an adjustable frequency divider a second oscillator supplying a stabilized reference frequency connected to the second input of said phase discriminator through a second fixed ratio frequency divider identical to the said first fixed ratio divider.

According to one feature of the present invention, the output of said variable frequency first oscillator and the outputs of the stages of said first fixed ratio frequency divider are connected respectively to the terminals of a first commutator having a wiper connected to a terminal forming the output terminal of the generator, the output of said fixed frequency second oscillator being connected to the wiper of a second commutator, the terminals of which are connected respectively to the outputs of the dividing stages of said second fixed ratio frequency divider.

According to another feature of the invention said first and second commutators have their wipers mechanically interconnected, so that said first and second fixed ratio dividers have the same dividing ratio for each range of output frequencies. Owing to the presence of the first commutator, the quantization steps are P, 2P, 4P, 8P and 16P. Since the commutators are interconnected the passage from one sub-range to another will result in a division by P by 2, 4, 8 and 16 and the quantization steps at the output will be, P, $$2\times\frac{P}{2}=P,\ 4\times\frac{P}{4}=P\ .\ .\ .$$

According to another feature of the invention, the variable radio frequency divider comprises a shift-register type counting device associated with a memory means: the device being manually settable to a given number to establish the ratio N of the variable divider. The pulses of the input frequency are counted down to zero and one pulse is then emitted at the output for each completed count. The memory means resets the counter at the set number and the operation repeats itself in the same manner.

According to another feature of the present invention, said fixed ratio frequency dividers are of the integrated circuit type.

The operation of the generator according to the invention is described herein with reference to a device including mechanical commutators; however, it is obvious that these mechanical commutators and the coupling system can be replaced by known electronic switching circuits.

It is therefore an object of the present invention to provide a signal generator which eliminates or substantially avoids all of the disadvantages described above in connection with known generators of a similar nature.

It is another object of the invention to provide a signal generator of the type described which is capable of utilizing a variable ratio frequency divider with lower maximum operating frequency characteristics.

It is a further object of the invention to provide a signal generator of the type described including a variable ratio frequency divider of the integrated circuit type.

It is still another object of the present invention to provide a signal generator capable of providing a plurality of frequency sub-ranges lower than the range of the variable frequency oscillator forming the basic source of signal energy.

Other advantages and features of the invention will be apparent from the following detailed description of the invention when considered with reference to the attached drawing which schematically illustrates a particular embodiment of the invention.

*Detailed description of the invention*

This generator comprises a relatively high frequency controllable oscillator 10 generating a signal F and having an output terminal 101 connected to an input terminal 141 of a phase discriminator 14 through a first fixed ratio frequency divider 11 connected in series with a variable ratio frequency divider 12.

The fixed radio frequency divider 11 comprises a plurality of series-connected stages having, respectively, dividing ratios of *a*, *b*, *c* and *d*. At the output *a'*, *b'*, *c'* and *d'* of said stages the frequencies are respectively *F/a*, *F/ab*, *F/abc* and *F/abcd*.

The output terminal 101, and the points *a'*, *b'*, *c'* and *d'* are respectively connected to the terminals 1, 2, 3, 4 and 5 of a commutator $C_1$, which may be a rotary type commutator as illustrated. The wiper 6 of the commutator $C_1$ is connected to a terminal 18 serving as the output terminal of the generator according to the invention. As mentioned above the commutator $C_1$ may be an electronic switching circuit having a function similar ot that of a mechanical commutator.

The element 12 is preferably a counter of the inverted type working as a frequency divider with a variable ratio N, and is associated with a memory-storage indicating device 13. With the device 13 set to a given number, the counter 12 counts the cycles down to zero and then emits one output pulse. The memory device then resets the counter to the same given number and the counter counts again down to zero.

Thus, the frequency *f* applied to the input 141 of the phase discriminator 14 is *F/a.b.c.d.N*. The generator further comprises a second oscillator 16 which is a high stability quartz oscillator supplying a frequency $F_o$. The output 161 of the oscillator 16 is connected to the wiper 7 of a second commutator $C_2$ having terminals 1, 2, 3, 4 and 5 respectively connected to terminals 151, *a''*, *b''*, *c''*, *d''*, of fixed ratio frequency divider 15. In principle the frequency divider 15 is identical to the divider 11 or at least provides dividing ratios equal to the ratios *a*, *b*, *c*, and *d*.

The wipers 6 and 7 of the commutators $C_1$ and $C_2$ are synchronized in position, in order to provide the same dividing ratios for a given position, for example, by means of a mechanical transmission shaft connected between the commutators, as schematically illustrated by the dotted line 8.

The output *d''* of the divider 15 is connected to the input 142 of the phase discriminator 14, the output 143 of which is connected through a conductor 102 to a control device of the variable oscillator 10. This control device is, for example, of the type comprising a nonlinear reactance schematically illustrated by element 17 responsive to an error signal to adjust the output frequency of the variable oscillator 10. The phase discriminator 14 supplies at 143 a feedback the value of which is a function of the frequencies applied to input terminals 141 and 142. The feedback signal is applied to the control element of the variable oscillator 10 until the coincidence of the frequencies *f=F/a.b.c.d.N* and *P* (output *d''* from divider 15) is achieved in the phase discriminator. Hence the oscillator 10 supplies a synchronized frequency F and the desired regulated frequency $F_s$ is supplied at the output 18.

By way of example, let it be assumed that the frequency $F_o$ of the fixed oscillator 16 is equal to 100 kilocycles. F is the frequency of the variable oscillator 10, F' the frequency at the input of the variable range divider 12, *f* the frequency of the output of the variable range divider 12, and P the frequency at the output of the chain of dividers 15. It is assumed that all of the divider elements are binary in nature.

The operation may be more clearly understood from the following table of exemplary values wherein the frequencies have been expressed in kilocycles:

| | P | f | F' | $F_s$ | N |
|---|---|---|---|---|---|
| Position 1-1 | 100/16 | 100/16 | N. 100/16 | N. 1 00 | 200-399 |
| Position 2-2 | 100/8 | 100/8 | N. 100/8 | N. 100 | 100-199 |
| Position 3-3 | 100/4 | 100/4 | N. 100/4 | N. 100 | 50-99 |
| Position 4-4 | 100/2 | 100/2 | N. 100/2 | N. 100 | 25-49 |
| Position 5-5 | 100 | 100 | N. 100 | N. 100 | 13-24 |

In the case where the fixed ratio dividers are binary trigger circuits, the wipers 6 and 7 being on one of the respective terminals 1 to 5, for a given position of these wipers, the frequency $F_s$ at 18 will be within one of the following bands: 20–40 mc., 10–20 mc., 5–10 mc., 2.5–5 mc. and 1.25–2.5 mc.

Thus it is possible to obtain in the band 1.3–40 mc., output frequencies quantized by one hundred kilocycles, the scanning and synchronization being automatically carried out once the counter is manually set to the value N.

Obviously the numerical values referred to in the present specification are given only by way of example to make possible a better understanding of the invention and are in no way to be considered as limitations of the scope of the invention.

We have shown and described one embodiment in accordance with the present invention. It is understood that the same is not limited thereto but is susceptible of numerous changes and modifications as known to a person skilled in the art and we, therefore, do not wish to be limited to the details shown and described herein but intended to cover all such changes and modifications as are encompassed by the scope of the appended claims.

We claim:

1. A frequency generator comprising,
a phase discriminator,
a divider circuit comprising a first fixed ratio frequency divider connected in series with a variable ratio frequency divider,
a variable frequency oscillator connected via said divider circuit to a first input of said phase discriminator,
a second fixed ratio frequency divider,
a fixed reference frequency oscillator connected via said second fixed ratio frequency divider to a second input of said phase discriminator, the output of said phase discriminator being connected to said variable frequency oscillator to control the frequency thereof,
said first and second fixed ratio frequency dividers each consisting of a plurality of serially connected elementary dividers, and
first switching means for selectively connecting one of the outputs of said variable frequency oscillator and said elementary dividers of said first fixed ratio divider to an output terminal forming the output of the generator.

2. The combination defined in claim 1 further including second switching means for selectively connecting the output of said fixed reference frequency oscillator to one of the inputs of said elementary dividers of said second fixed ratio divider and said second input of said phase discriminator.

3. The combination defined in claim 2 further comprising means for interconnecting said first and second switching means to effect synchronous operation thereof maintaining the dividing ratios of said first and second fixed ratio frequency dividers equal.

4. The combination defined in claim 2 wherein said first and second switching means are mechanical commutators each having selectively actuatable wipers, and further including means mechanically interconnecting said wipers.

5. The combination defined in claim 1 wherein said variable ratio frequency divider comprises a pulse counter of the integrated circuit type.

6. The combination defined in claim 5 further including memory control means connected to said pulse counter for limiting the repetitious count thereof to a preselected value.

7. A frequency generator comprising
a phase discriminator having first and second inputs and an output providing an error signal,
a variable frequency oscillator connected to the output of said phase discriminator having an output providing a stable frequency F within a range of frequencies under control of said error signal,
a first fixed ratio frequency divider connected in series with a variable ratio frequency divider connected between the output of said variable frequency oscillator and the first input of said phase discriminator and having a combined ratio $n_1$,
a fixed reference frequency oscillator generating a stable frequency $F_0$ at the output thereof,
a second fixed ratio frequency divider having a ratio $n_2$ connected between the output of said fixed reference frequency oscillator and the second input of said phase discriminator,
said stable frequency F being determined by the relationship $$F=\frac{n_1}{n_2}F_0$$

said first and second fixed ratio frequency dividers each comprising a plurality of serially connected elementary dividers, said fixed reference frequency oscillator being selectively connected to the input of one of the elementary dividers of said second fixed ratio frequency divider, and
switch means including a first switch connected to said first fixed ratio frequency divider for selectively connecting one of the outputs of said variable frequency oscillator and said elementary dividers of said first fixed ratio frequency divider to an output terminal forming the output of the generator.

8. The combination defined in claim 7 wherein said first and second fixed ratio frequency dividers are identical and said variable ratio frequency divider has a variable ratio $n_3$ so that the frequency F is determined by the relationship $F=n_3F_0$.

9. The combination defined in claim 7 wherein said switch means further includes a second switch connected to said second fixed ratio frequency divider for selectively switching the output of said fixed reference frequency oscillator from one elementary divider to another thereby maintaining the equal ratio of said first and second fixed ratio dividers.

10. The combination defined in claim 9 wherein said switch means includes first and second mechanical commutators connected to the elementary dividers of said first and second fixed ratio frequency dividers, respectively, and mechanically linked for synchronous operation.

11. The combination defined in claim 7 wherein said variable ratio frequency divider comprises a pulse counter of the integrated circuit type.

References Cited

UNITED STATES PATENTS

| | | | |
|---|---|---|---|
| 3,163,823 | 12/1964 | Kellis et al. | 331—18 X |
| 3,165,706 | 1/1965 | Sarratt | 331—18 |
| 3,319,178 | 5/1967 | Broadhead | 331—25 X |

OTHER REFERENCES

L. F. Blachowicz: "Dial Any Channel to 500 Mhz," Electronics, May 2, 1966, pp. 60–63.

ROY LAKE, *Primary Examiner.*

S. H. GRIMM, *Assistant Examiner.*